(12) United States Patent
Kobayashi et al.

(10) Patent No.: US 12,543,536 B2
(45) Date of Patent: Feb. 3, 2026

(54) ELECTROSTATIC CHUCK

(71) Applicant: TOTO LTD., Fukuoka (JP)

(72) Inventors: Kouta Kobayashi, Fukuoka (JP);
Yutaka Momiyama, Fukuoka (JP);
Masafumi Ikeguchi, Fukuoka (JP);
Jumpei Uefuji, Fukuoka (JP)

(73) Assignee: TOTO LTD., Fukuoka (JP)

( * ) Notice: Subject to any disclaimer, the term of this patent is extended or adjusted under 35 U.S.C. 154(b) by 0 days.

(21) Appl. No.: 18/955,571

(22) Filed: Nov. 21, 2024

(65) Prior Publication Data

US 2025/0174484 A1    May 29, 2025

(30) Foreign Application Priority Data

Nov. 27, 2023 (JP) .................... 2023-199785
Jan. 24, 2024 (JP) .................... 2024-008773

(51) Int. Cl.
*H01L 21/683* (2006.01)

(52) U.S. Cl.
CPC ................ *H01L 21/6833* (2013.01)

(58) Field of Classification Search
CPC .................................. H01L 21/6833
See application file for complete search history.

(56) References Cited

U.S. PATENT DOCUMENTS

| | | | | |
|---|---|---|---|---|
| 2013/0120896 A1* | 5/2013 | Ono | ............ | C04B 35/111 |
| | | | | 361/233 |
| 2015/0070815 A1* | 3/2015 | Kugimoto | ......... | C04B 35/645 |
| | | | | 977/932 |
| 2015/0243541 A1 | 8/2015 | Hayashi | | |
| 2017/0057875 A1* | 3/2017 | Ishizuka | .......... | C04B 35/78 |
| 2020/0027770 A1* | 1/2020 | Hidaka | ......... | H01J 37/32715 |
| 2020/0350196 A1* | 11/2020 | Nagai | ............. | B28B 1/001 |
| 2021/0268616 A1 | 9/2021 | Sato | | |
| 2022/0223455 A1 | 7/2022 | Hidaka et al. | | |
| 2023/0142870 A1* | 5/2023 | Sato | .......... | H01L 21/67103 |
| | | | | 279/128 |

FOREIGN PATENT DOCUMENTS

| | | | |
|---|---|---|---|
| EP | 1168436 A2 | 1/2002 | |
| JP | H07335731 A | 12/1995 | |
| JP | H1117065 A | 1/1999 | |
| JP | 2001338970 A | 12/2001 | |
| JP | 2002134926 A | 5/2002 | |
| JP | 2011222978 A | 11/2011 | |

(Continued)

*Primary Examiner* — Thienvu V Tran
*Assistant Examiner* — Muaamar Qahtan Al-Taweel
(74) *Attorney, Agent, or Firm* — Seed Intellectual Property Law Group LLP (57) ABSTRACT

An electrostatic chuck 10 includes a dielectric substrate 100, a base plate 200 which supports the dielectric substrate 100, and a joining layer 300 which joins the dielectric substrate 100 and the base plate 200. A value of a dielectric tangent of the joining layer 300 when a temperature of the joining layer 300 is 20° C. is set as a reference value. In the electrostatic chuck 10, when the temperature of the joining layer 300 has changed from 20° C. to −60° C., a range in which the value of the dielectric tangent of the joining layer 300 fluctuates falls within a range from 50% to 200% of the reference value.

3 Claims, 6 Drawing Sheets

(56) References Cited

FOREIGN PATENT DOCUMENTS

| | | | |
|---|---|---|---|
| JP | 2014207374 | A | 10/2014 |
| JP | 2015162490 | A | 9/2015 |
| JP | 2017203094 | A | 11/2017 |
| JP | 2019165184 | A | 9/2019 |
| JP | 2022068708 | A | 5/2022 |
| KR | 20110113291 | A | 10/2011 |
| KR | 10-2023-0068307 | A | 5/2023 |
| WO | 2020066237 | A1 | 4/2020 |
| WO | 2020235651 | A1 | 11/2020 |

\* cited by examiner

ELECTROSTATIC CHUCK

CROSS-REFERENCE TO RELATED APPLICATION

This application is based upon and claims the benefit of priority from Japanese Patent Application No. 2023-199785 filed on Nov. 27, 2023, and Japanese Patent Application No. 2024-008773 filed on Jan. 24, 2024, the entire contents of which are incorporated herein by reference.

FIELD

The present invention relates to an electrostatic chuck.

BACKGROUND

In a semiconductor manufacturing apparatus such as an etching apparatus, an electrostatic chuck is provided as an apparatus for attracting and holding a wafer such as a silicon wafer to be processed. As described in Japanese Patent Laid-Open No. 2015-162490, the electrostatic chuck includes a dielectric substrate (substrate material) to which an attraction electrode is provided and a base plate (base section) which supports the dielectric substrate, and has a configuration in which these are joined to each other. When a voltage is applied to the attraction electrode, an electrostatic force is generated, and the wafer placed on the dielectric substrate is attracted and held.

During the process such as etching, a temperature in each section of the wafer needs to be kept at an appropriate temperature. In order that an in-plane temperature distribution of the wafer during the process becomes an appropriate distribution, a configuration of each section of the electrostatic chuck is appropriately designed such as, for example, routing of a coolant flow path to be formed inside the base plate or arrangement of a gas hole for supplying a gas to a rear surface side of the wafer.

When plasma is to be generated in the semiconductor manufacturing apparatus, a high-frequency voltage is applied between a pair of electrodes. According to this, an alternating electric field is applied to each section of the electrostatic chuck. The above-described Patent Document Japanese Patent Laid-Open No. 2015-162490 illustrates a configuration example of a case where a part (for example, a base plate) of the electrostatic chuck is used as one of the above-described electrodes. In particular, in such a configuration, the alternating electric field applied to each section of the electrostatic chuck is increased.

SUMMARY

The inventors of the present invention have gained new knowledge that when a temperature of the joining layer changes according to an operation condition of the semiconductor manufacturing apparatus or the like, along with that change, a value of a dielectric tangent of the joining layer also changes. When the value of the dielectric tangent changes, since a heating value of the joining layer also changes due to the application of the alternating electric field, the in-plane temperature distribution of the wafer is affected by that change.

As described above, in the electrostatic chuck, in order that the in-plane temperature distribution of the wafer during the process becomes an appropriate distribution, the routing of the coolant flow path or the like is appropriately designed. However, when the heating value of the joining layer significantly changes along with the change of the operation condition or the like, a premise of the design is broken, and a case may also occur where the in-plane temperature distribution of the wafer is not appropriately kept.

The present invention has been made in view of the above-described issue, and is aimed to provide an electrostatic chuck which can keep an appropriate in-plane temperature distribution of a wafer during a process.

To address the above-described issue, an electrostatic chuck according to an aspect of the present invention includes a dielectric substrate, a base plate which supports the dielectric substrate, and a joining layer which joins the dielectric substrate and the base plate. In a case where a value of a dielectric tangent of the joining layer when a temperature of the joining layer is 20° C. is set as a reference value, in this electrostatic chuck, when the temperature of the joining layer has changed from 20° C. to −60° C., a range in which the value of the dielectric tangent of the joining layer fluctuates falls within a range from 50% to 200% of the reference value.

The electrostatic chuck with such a configuration is configured such that even when the temperature of the joining layer changes from 20° C. to −60° C., the fluctuation of the value of the dielectric tangent during that change falls within the range from 50% to 200% of the reference value. Even in a case where the temperature of the joining layer has changed, since a fluctuation of a heating value of the joining layer is suppressed to be smaller than before, it is possible to continuously keep the appropriate in-plane temperature distribution of the wafer.

According to the aspect of the present invention, it is possible to provide the electrostatic chuck which can keep the appropriate in-plane temperature distribution of the wafer during the process.

DETAILED DESCRIPTION

Hereinafter, the present embodiment will be described with reference to the accompanying drawings. To facilitate understanding of the description, the same components in the respective drawings are denoted by same reference signs as much as possible to omit repeated description.

An electrostatic chuck 10 according to the present embodiment is configured to attract and hold a wafer W set as a process target by an electrostatic force inside a semiconductor manufacturing apparatus which is not illustrated in the drawing such as, for example, an etching apparatus. The wafer W as an object to be attracted is, for example, a silicon wafer. The electrostatic chuck 10 may be used in an apparatus other than the semiconductor manufacturing apparatus.

Figure 1:
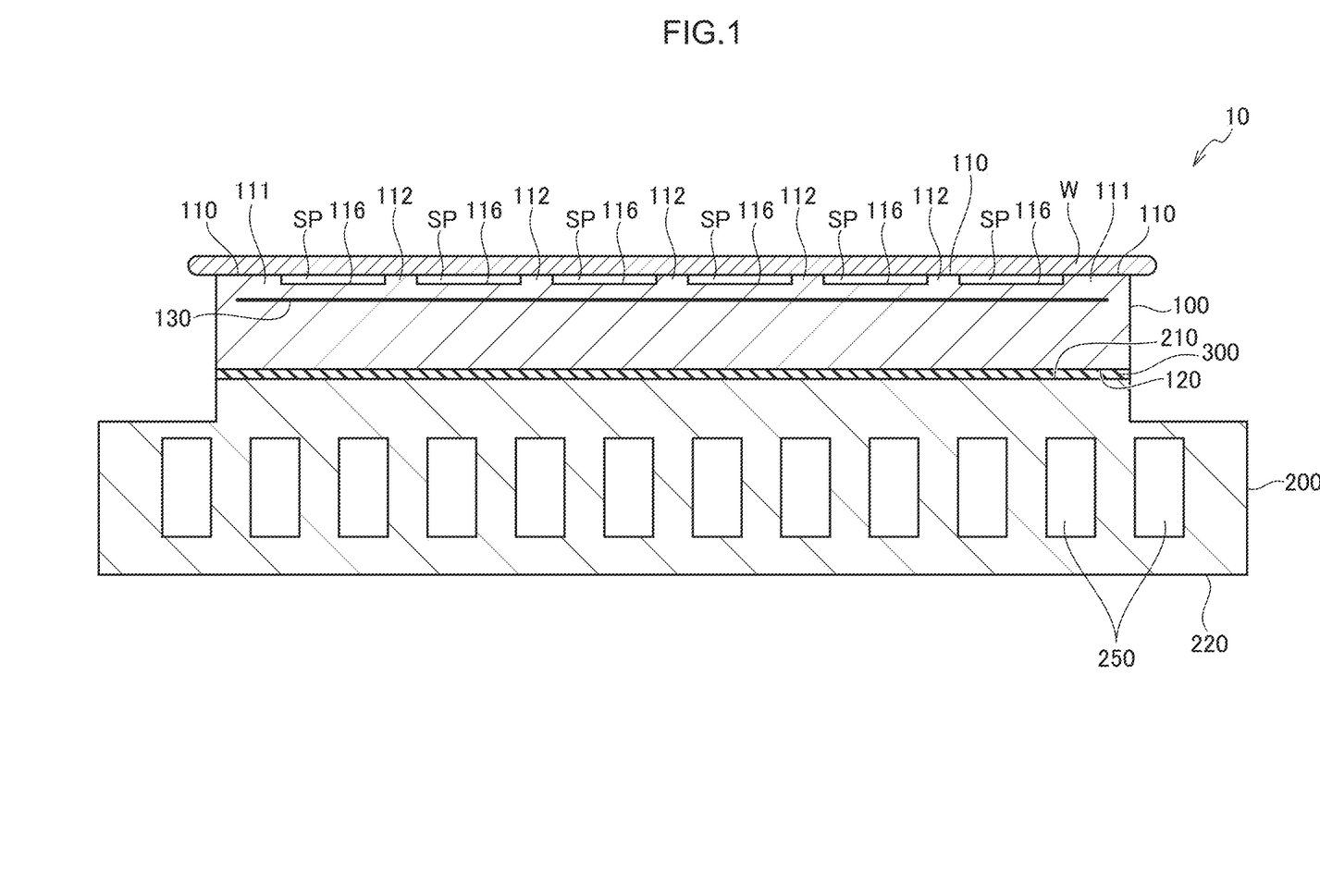
FIG. 1 is a cross-sectional view schematically illustrating a configuration of an electrostatic chuck according to the present embodiment.

FIG. 1 is a cross-sectional view schematically illustrating a configuration of the electrostatic chuck 10 in a state in which the wafer W is attracted and held. The electrostatic chuck 10 includes a dielectric substrate 100 and a base plate 200.

The dielectric substrate 100 is a substantially disk-shaped member formed of a ceramic sintered body. The dielectric substrate 100 contains, for example, highly pure aluminum oxide ($Al_2O_3$), but may contain other materials. A ceramics purity or type, an additive, or the like in the dielectric substrate 100 may be appropriately set by taking into account plasma resistance or the like needed for the dielectric substrate 100 in the semiconductor manufacturing apparatus.

A surface 110 on an upper side in FIG. 1 in the dielectric substrate 100 serves as a "placement surface" on which the wafer W is placed. A surface 120 on a lower side in FIG. 1 in the dielectric substrate 100 serves as a "surface to be joined" which is joined to the base plate 200 via a joining layer 300. A viewpoint in a case where the electrostatic chuck 10 is viewed from the surface 110 side along a direction perpendicular to the surface 110 will be hereinafter also referred to as a "top view".

An attraction electrode 130 is embedded inside the dielectric substrate 100. The attraction electrode 130 is a thin planar layer made of a metallic material such as, for example, tungsten, and is arranged so as to be parallel to the surface 110. In addition to tungsten, as a material of the attraction electrode 130, molybdenum, platinum, palladium, or the like may be used. When a voltage is applied to the attraction electrode 130 from an outside via a feed line which is not illustrated in the drawing, an electrostatic force is generated between the surface 110 and the wafer W, and according to this, the wafer W is attracted and held. As a configuration of the above-described feed line, various configurations in related art can be adopted. The single attraction electrode 130 may be provided as so-called a "monopolar" electrode as in the present embodiment, but may also include two attraction electrodes as so-called "bipolar" electrodes.

As illustrated in FIG. 1, a space SP is formed between the dielectric substrate 100 and the wafer W. When a process such as etching is performed in the semiconductor manufacturing apparatus, a helium gas for temperature regulation is supplied to the space SP from the outside via a gas hole which is not illustrated in the drawing. When the helium gas is caused to be present between the dielectric substrate 100 and the wafer W, a thermal resistance between the dielectric substrate 100 and the wafer W is regulated, and according to this, a temperature of the wafer W is maintained at an appropriate temperature. It is noted that the gas for temperature regulation to be supplied to the space SP may be a gas of a type different from helium.

A seal ring 111 and a dot 112 are provided on the surface 110 which serves as the placement surface, and the space SP described above is formed around the seal ring 111 and the dot 112.

The seal ring 111 is a wall which defines the space SP in a position corresponding to an outermost circumference. An upper end of the seal ring 111 becomes a part of the surface 110 and abuts against the wafer W. It is noted that the seal ring 111 may include a plurality of seal rings 111 provided so as to divide the space SP. With such a configuration, a pressure of the helium gas in each of the spaces SP can be individually regulated, and a surface temperature distribution of the wafer W during the process can be set to be close to uniformity.

A part denoted by a reference sign "116" in FIG. 1 is a bottom of the space SP. Hereinafter, this part may also be referred to as a "bottom 116". The seal ring 111 is formed as a result of digging a part of the surface 110 to a position of the bottom 116 together with the dot 112 which will be described next.

The dot 112 is a circular protrusion which protrudes from the bottom 116. The dot 112 includes a plurality of dots 122 to be provided. The plurality of dots 122 are substantially uniformly distributed and arranged on the placement surface of the dielectric substrate 100. An upper end of each of the dots 112 becomes a part of the surface 110, and abuts against the wafer W. By providing the plurality of thus configured dots 112, warping of the wafer W is reduced.

The base plate 200 is a substantially disk-shaped member which supports the dielectric substrate 100. The base plate 200 is made of a metallic material such as, for example, aluminum. A surface 210 on the upper side in FIG. 1 in the base plate 200 serves as a "surface to be joined" which is joined to the dielectric substrate 100 via the joining layer 300.

The joining layer 300 is a layer provided between the dielectric substrate 100 and the base plate 200 to join those components. The joining layer 300 is formed by causing an adhesive made of an insulating material to be cured. As the above-described adhesive, for example, a silicone-based adhesive, an epoxy-based adhesive, a polyimide-based adhesive, or the like can be used. The joining layer 300 may be obtained by causing an adhesive of other types to be cured. In any case, a material with the highest possible thermal conductivity is preferably used as the material of the joining layer 300 such that a thermal resistance between the dielectric substrate 100 and the base plate 200 is reduced.

According to the present embodiment, each of the electrostatic chuck 10 using a silicone adhesive as the joining layer 300 and the electrostatic chuck 10 using a polyimide-based adhesive as the joining layer 300 is produced. Out of each of the embodiments, the electrostatic chuck 10 including the joining layer 300 made of the silicone adhesive will be hereinafter also referred to a "present embodiment 1". The electrostatic chuck 10 including the joining layer 300 made of the polyimide-based adhesive will be hereinafter also referred to a "present embodiment 2".

An insulating film may be formed on a surface of the base plate 200. As the insulating film, for example, an alumina film formed through thermal spraying can be used. When the surface of the base plate 200 is covered by the insulating film, it is possible to increase a withstand voltage of the base plate 200.

A coolant flow path 250 through which a coolant flows is formed inside the base plate 200. When the process such as etching is performed in a semiconductor manufacturing apparatus, the coolant is supplied to the coolant flow path 250 from the outside, and according to this, the base plate 200 is cooled down. Heat generated in the wafer W during the process is transferred to the coolant via the helium gas in the space SP, the dielectric substrate 100, and the base plate 200, and the heat is exhausted to the outside together with the coolant.

When the process such as etching is performed in the semiconductor manufacturing apparatus, a temperature in each section of the wafer W needs to be kept at an appropriate temperature. In order that the in-plane temperature distribution of the wafer W during the process becomes an appropriate distribution, in the electrostatic chuck, a configuration of each section is appropriately designed in general. The above-described "configuration" which may affect the in-plane temperature distribution of the wafer W includes, for example, routing of the coolant flow path 250 formed inside the base plate 200, arrangement of a gas hole (not illustrated) for supplying a gas to the space SP, shapes and arrangements of the dot 112 and the seal ring 111 in the dielectric substrate 100, and the like. In a case where a heater configured to heat the dielectric substrate 100 is provided in the electrostatic chuck 10, performance, arrangement, and the like of the heater may be included in the above-described "configuration".

When plasma is to be generated in the semiconductor manufacturing apparatus, a high frequency voltage is applied between a pair of electrodes. According to this, an alternating electric field is applied to each section of the electrostatic chuck 10. For example, one of the above-described electrodes is arranged in a position on an upper side of the wafer W (on a side opposite to the electrostatic chuck 10). As the other of the above-described electrodes, the base plate 200 is used in many cases, but a member other than the base plate 200 may be used. In any case, a relatively large alternating electric field is applied to each member constituting the electrostatic chuck 10 such as the joining layer 300.

When the alternating electric field is applied to the joining layer 300, part of energy of the alternating electric field turns into heat to increase a temperature of the joining layer 300. The inventors of the present invention have conducted a research on a dielectric tangent of a material making the joining layer 300 to confirm an influence of such an alternating electric field.

Figure 2:
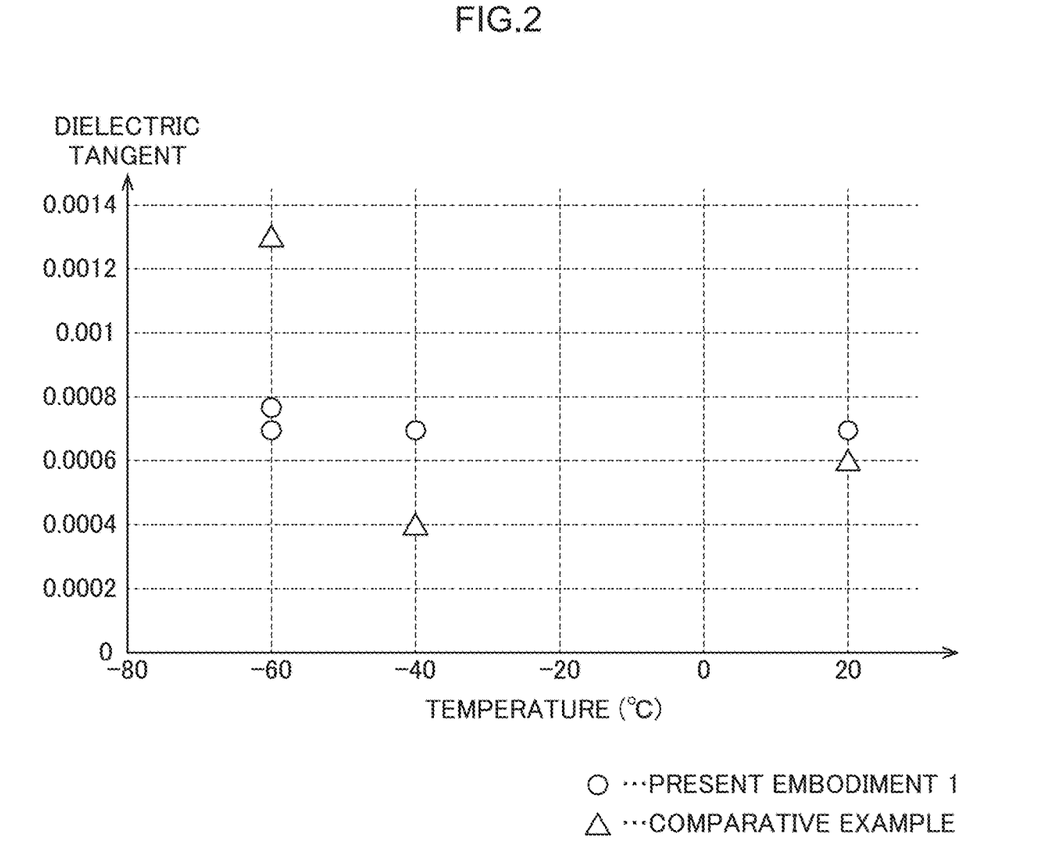
FIG. 2 is a diagram illustrating a relationship between a temperature and a dielectric tangent of a joining layer.
Figure 3:
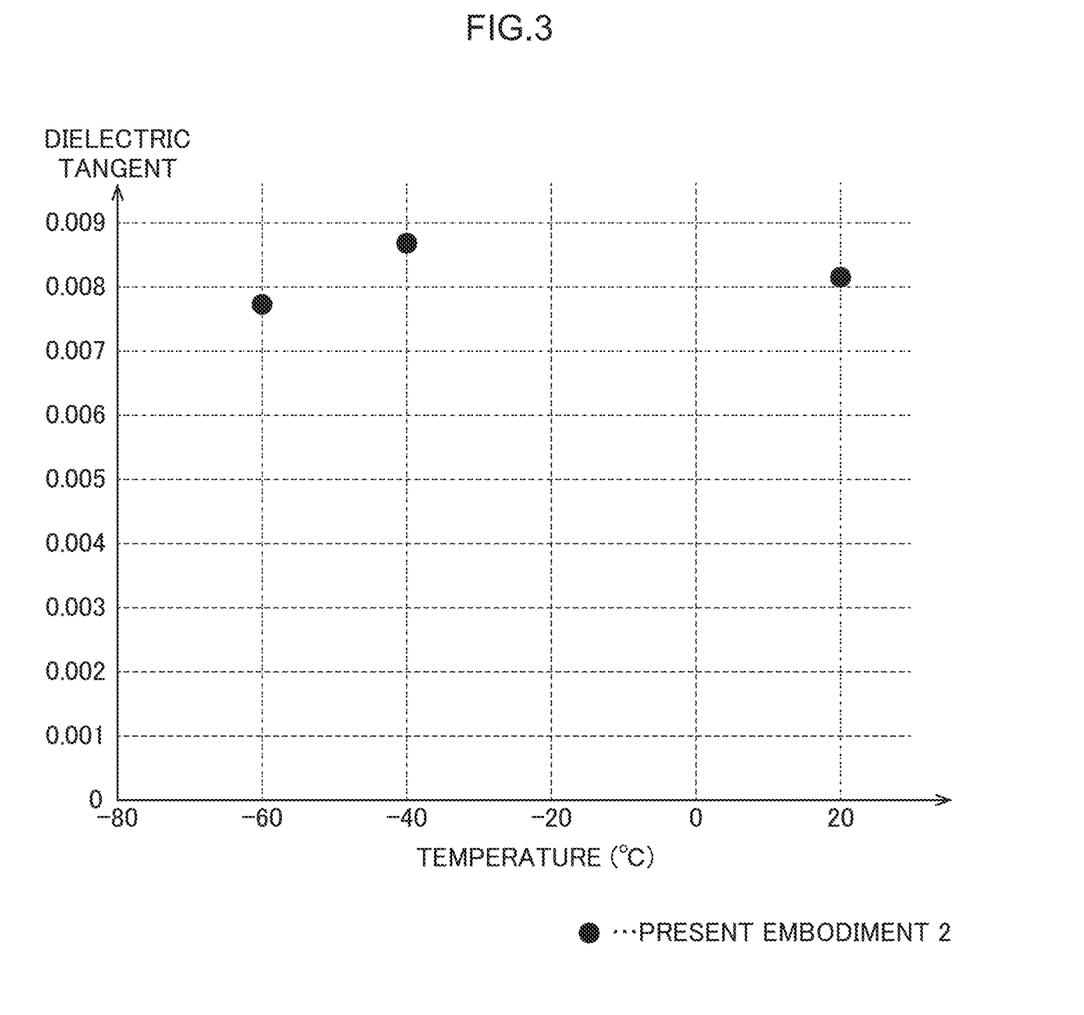
FIG. 3 is a diagram illustrating a relationship between the temperature and the dielectric tangent of the joining layer.

A result of the research will be described. FIG. 2 and FIG. 3 illustrate examples of a relationship between a temperature of the joining layer 300 (horizontal axis) and a value of a dielectric tangent of the joining layer 300 (vertical axis).

Each data plotted with a triangular dot in FIG. 2 indicates, as a "comparative example" of the present embodiment, a result obtained by forming the joining layer 300 using a general silicone adhesive and measuring a value of the dielectric tangent of the joining layer 300 at each temperature. Each data is obtained through the measurement in a state in which the alternating electric field at 400 kHz is applied to the joining layer 300.

In this comparative example, it was confirmed that when the temperature of the joining layer 300 decreased from 20° C., along with this, the value of the dielectric tangent of the joining layer 300 fluctuated. The value of the dielectric tangent of the joining layer 300 when the joining layer 300 is at 20° C. will be hereinafter also referred to as a "reference value". In this comparative example, as the temperature of the joining layer 300 decreased from 20° C., the value of the dielectric tangent of the joining layer 300 decreased from the reference value (in this comparative example, 0.0006). Around timing at which the temperature of the joining layer 300 dropped below −40° C., the value of the dielectric tangent abruptly increased, and at a point in time when the temperature became −60° C., the value of the dielectric tangent increased to a level of about 220% of the reference value.

In this manner, it was found that when the temperature of the joining layer 300 changed, along with this, the value of the dielectric tangent of the joining layer 300 also changed. When the value of the dielectric tangent changes, since a heating value of the joining layer 300 also changes due to the application of the alternating electric field, the in-plane temperature distribution of the wafer W is affected by the change. When the value of the dielectric tangent exceeds 200% of the reference value, the influence on the temperature of the wafer W becomes large enough to be nonnegligible.

As described above, in the electrostatic chuck 10, in order that the in-plane temperature distribution of the wafer W during the process becomes an appropriate distribution, the routing or the like of the coolant flow path 250 is appropriately designed. However, for example, when the heating value of the joining layer 300 significantly changes along with the change or the like of the operation condition of the semiconductor manufacturing apparatus, since a premise of the design is broken, a case may occur where the in-plane temperature distribution of the wafer W is not appropriately kept.

Figure 5:
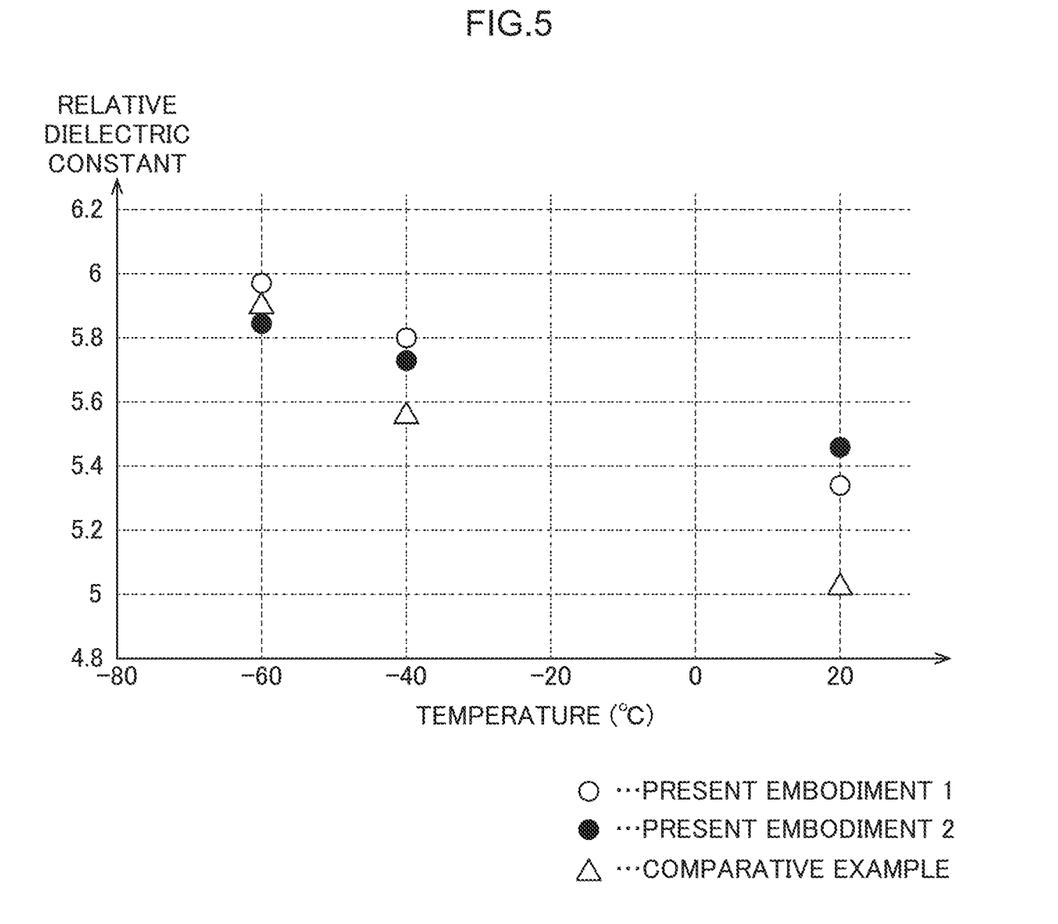
FIG. 5 is a diagram illustrating a relationship between the temperature and the relative dielectric constant of the joining layer.

FIG. 5 illustrates an example of a measurement result of a relationship between the temperature (horizontal axis) and a relative dielectric constant (vertical axis) of the joining layer 300 with regard to each of the joining layer 300 according to the present embodiment 1, the joining layer 300 according to the present embodiment 2, and the joining layer 300 according to the comparative example. The relative dielectric constant is measured in a state in which the alternating electric field at 400 kHz is applied to the joining layer 300.

Figure 6:
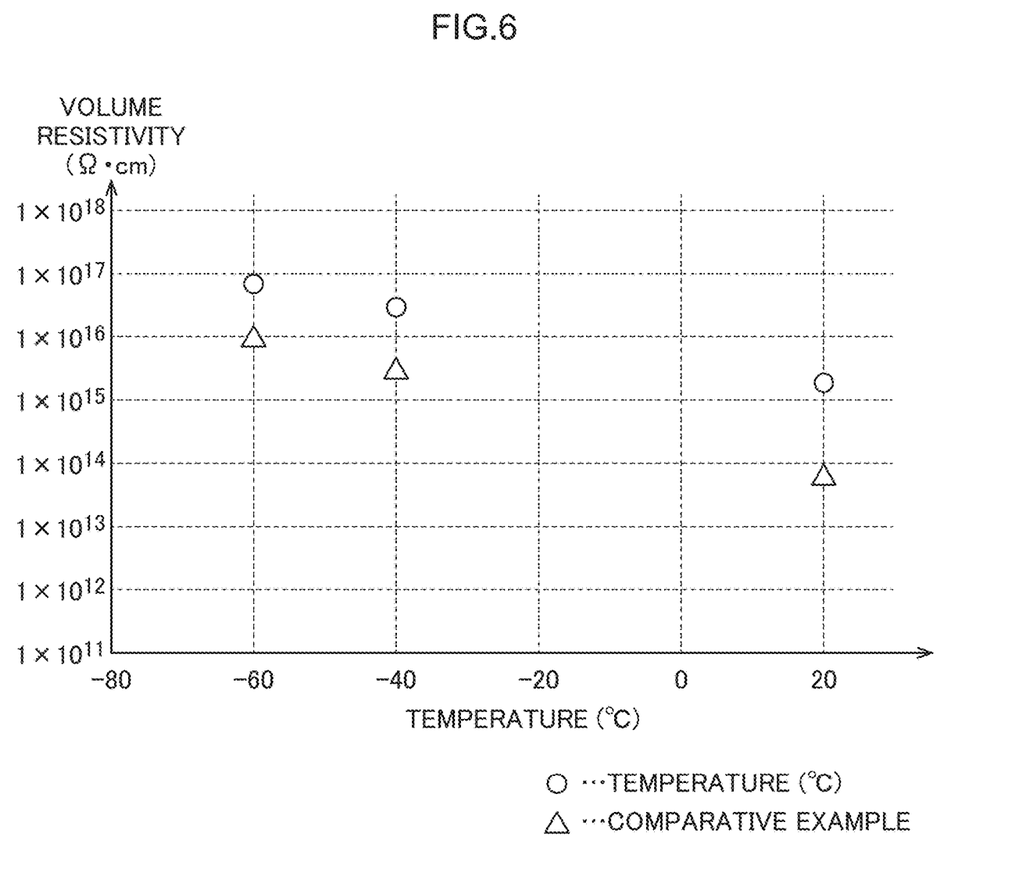
FIG. 6 is a diagram illustrating a relationship between the temperature and a volume resistivity of the joining layer.

FIG. 6 illustrates an example of a measurement result of a relationship between the temperature (horizontal axis) and a volume resistivity (vertical axis) of the joining layer 300 with regard to each of the joining layer 300 according to the present embodiment 1 and the joining layer 300 according to the comparative example. The vertical axis in FIG. 6 is a logarithmic axis.

As illustrated in these drawings, when the temperature of the joining layer 300 changes, it is found that the relative dielectric constant and the volume resistivity significantly of the joining layer 300 also change. Such fluctuations of various physical properties serve as factors of increased difficulty for the design of the electrostatic chuck 10 for causing the in-plane temperature distribution of the wafer W to be an appropriate distribution. Under various operation conditions of the semiconductor manufacturing apparatus, to carry out such a design that cooling performance of the electrostatic chuck 10 is appropriately demonstrated, the number of physical properties which fluctuate depending on the temperature is preferably set to be as low as possible.

In view of the above, with regard to the joining layer 300 of the present embodiment, the inventors of the present invention attempted to suppress the above-mentioned temperature dependence of the dielectric tangent by, for example, appropriately selecting the adhesive that is the material of the joining layer 300 or the like. Each data plotted with a circular dot in FIG. 2 indicates a result obtained by measuring (or calculating through simulation) the value of the dielectric tangent at each temperature with regard to a sample cut out from the joining layer 300 of the present embodiment 1. Each data is obtained through the measurement or the like in a state in which the alternating electric field at 400 kHz is applied to the joining layer 300 similarly as in the above-described comparative example.

The value of the dielectric tangent when the joining layer 300 was at 20° C., that is, the "reference value", was 0.0007 according to the present embodiment 1. In the electrostatic chuck 10 according to the present embodiment 1, even when the temperature of the joining layer 300 was changed from 20° C. to −60° C., the fluctuation of the value of the dielectric tangent during that change was hardly observed, and the value roughly equal to the reference value was maintained.

Each data plotted with a circular dot in FIG. 3 indicates a result obtained by measuring (or calculating through simulation) the value of the dielectric tangent at each temperature with regard to a sample cut out from the joining layer 300 of the present embodiment 2. Each data is obtained through the measurement or the like in a state in which the alternating electric field at 400 kHz is applied to the joining layer 300 similarly as in each data illustrated in FIG. 2.

The value of the dielectric tangent when the joining layer 300 was at 20° C., that is, the "reference value" was 0.0081 according to the present embodiment 2. The value of the dielectric tangent when the joining layer 300 was at −40° C. was 0.0086, and the value of the dielectric tangent when the joining layer 300 was −60° C. was 0.0076. In this manner, in the electrostatic chuck 10 according to the present embodiment 2, even when the temperature of the joining layer 300 was changed from 20° C. to −60° C., the fluctuation of the value of the dielectric tangent during that change was relatively small, and the value roughly equal to the reference value was maintained.

Figure 4:
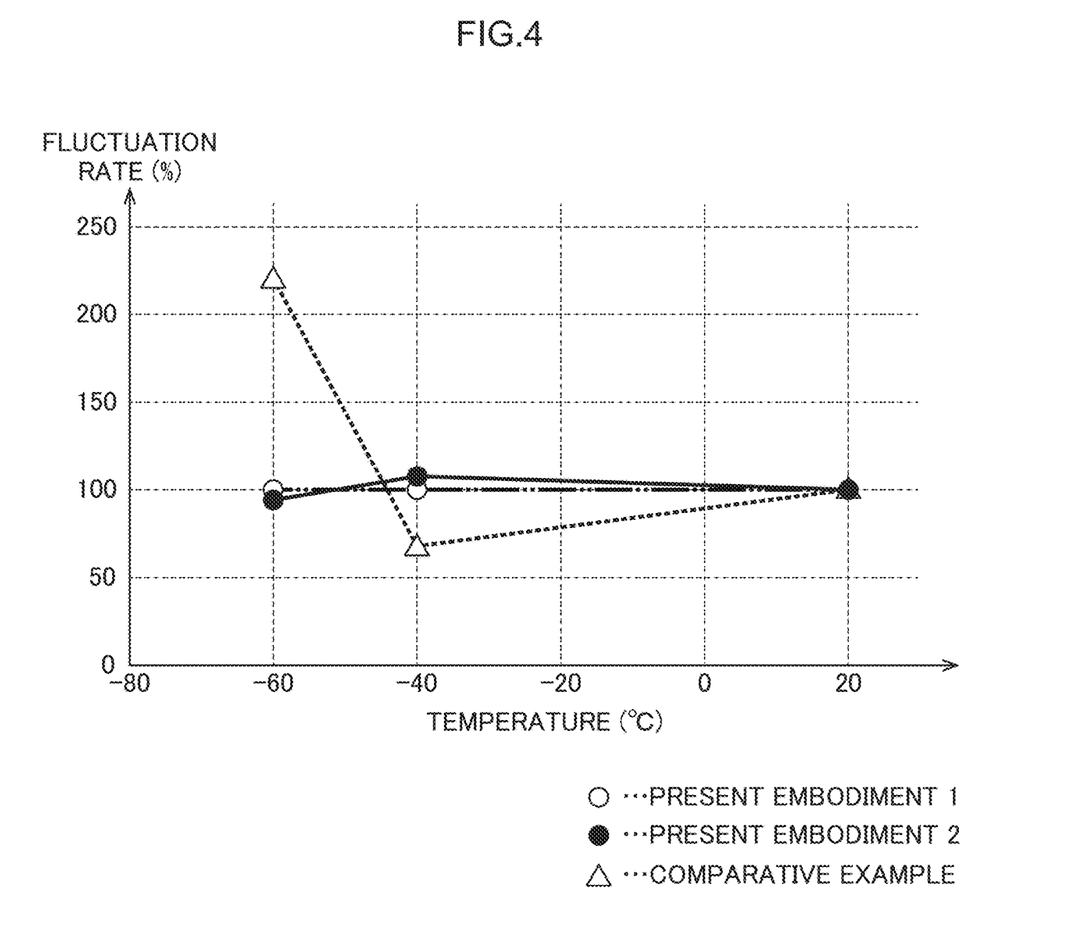
FIG. 4 is a diagram illustrating a relationship between the temperature and a fluctuation rate of the dielectric tangent of the joining layer.

FIG. 4 illustrates how the dielectric tangent of the joining layer 300 at each of the above-described samples changed from the reference value along with the temperature drop. A vertical axis in FIG. 4 represents a fluctuation of the value of the dielectric tangent which is expressed as a percentage when the value of the dielectric tangent at 20° C. (in other words, the reference value) is set as 100%, that is, a fluctuation rate.

As described above, in the comparative example, around timing at which the temperature of the joining layer 300 dropped below −40° C., the value of the dielectric tangent abruptly increased, and at a point in time when the temperature became −60° C., the value of the dielectric tangent increased to a level of about 220% of the reference value.

On the other hand, according to the present embodiment 1 (the silicone adhesive), even when the temperature of the joining layer 300 changed from 20° C. to −60° C., the fluctuation of the value of the dielectric tangent of the joining layer 300 was suppressed to be small to such an extent that the fluctuation is not observable, and the value of the dielectric tangent substantially remained at 100% of the reference value.

According to the present embodiment 2 (epoxy-based adhesive), when the temperature of the joining layer 300 changed from 20° C. to −40° C., the value of the dielectric tangent of the joining layer 300 increased to approximately 106% of the reference value. Thereafter, when the temperature of the joining layer 300 changed to −60° C., the value of the dielectric tangent of the joining layer 300 decreased to approximately 94% of the reference value. In this manner, in the joining layer 300 according to the present embodiment 2, the fluctuation of the value of the dielectric tangent fell within a range from 94% to 106% of the reference value.

As described above, in the electrostatic chuck 10 according to the present embodiments 1 and 2, the fluctuation of the value of the dielectric tangent of the joining layer 300 along with the temperature change is suppressed to be smaller than before. Due to the change or the like in the operation condition of the semiconductor manufacturing apparatus, even in a case where the temperature of the joining layer 300 during the process of the wafer W has changed, the value of the dielectric tangent of the joining layer 300 is maintained to a value roughly close to the reference value. Since the heating value in the joining layer 300 becomes almost the same as before the change in the operation condition, the cooling performance of the electrostatic chuck 10 is demonstrated as originally designed, and the in-plane temperature distribution of the wafer W is appropriately maintained.

The fluctuation of the value of the dielectric tangent of the joining layer 300 when the temperature of the joining layer 300 has changed from 20° C. to −60° C. preferably falls at least within a range from 50% to 200% of the reference value. When the change in the value of the dielectric tangent is suppressed to the above-mentioned level, since a fluctuation of the heating value of the joining layer 300 can be suppressed to be smaller than before, it is possible to continuously keep the appropriate in-plane temperature distribution of the wafer W.

The fluctuation of the value of the dielectric tangent when the temperature of the joining layer 300 has changed from 20° C. to −60° C. more preferably falls within a range from 90% to 110% of the reference value as in the present embodiments 1 and 2. When the change in the value of the dielectric tangent is suppressed in a range within +10% of the reference value, the fluctuation of the heating value of the joining layer 300 can be suppressed to be small enough to be negligible.

The value of the dielectric tangent when the temperature of the joining layer 300 changes from 20° C. to −60° C. is preferably regularly lower than 0.0008 as in the present embodiment 1. With such a configuration, not only a fluctuation width of the heating value of the joining layer 300 during the process but also an absolute value of the heating value can be suppressed to be sufficiently small.

As the adhesive used for the joining layer 300, an adhesive is preferably selected with which the fluctuation of the value of the dielectric tangent during the temperature drop falls within the above-described range. By mixing fillers in an adhesive in related art, it is possible to cause the fluctuation of the value of the dielectric tangent during the temperature drop to fall within the above-described range. For example, by mixing an inorganic material such as alumina as the fillers, it is possible to adjust the fluctuation width of the value of the dielectric tangent. In this case, it is found that as a mixing amount of fillers is increased, the value of the dielectric tangent becomes smaller, and a change amount of the dielectric tangent at the time of the low temperature also becomes smaller. It is noted however that when dispersibility of the fillers is not satisfactory and the fillers are aggregated, the value of the dielectric tangent may rather become large. Therefore, the fillers need to be mixed while attention is paid to avoid the aggregation.

The present embodiment has been described above with reference to the specific examples, but the present disclosure is not limited to these specific examples. Configurations obtained by adding appropriate design modifications to these specific examples by a person skilled in the art are also within the scope of the present disclosure as long as the configurations have a feature of the present disclosure. Each of the elements included in each of the specific examples described above and arrangements, conditions, shapes, and the like of the elements are not limited to those illustrated and can be modified as appropriate. For each of the elements included in each of the specific examples described above, a combination can be appropriately changed as long as a technical contradiction does not occur.

What is claimed is:
1. An electrostatic chuck comprising:
a dielectric substrate;
a base plate which supports the dielectric substrate; and a joining layer which joins the dielectric substrate and the base plate, wherein in a case where a value of a dielectric tangent of the joining layer when a temperature of the joining layer is 20° C. is set as a reference value, when the temperature of the joining layer has changed from 20° C. to −60° C., a range in which the value of the dielectric tangent of the joining layer fluctuates falls within a range from 50% to 200% of the reference value, the dielectric tangent indicating a dielectric change of the joining layer when an electric field is applied to the joining layer.

2. The electrostatic chuck according to claim 1, wherein when the temperature of the joining layer has changed from 20° C. to −60° C., the range in which the value of the dielectric tangent of the joining layer fluctuates falls within a range from 90% to 110% of the reference value.

3. The electrostatic chuck according to claim 1, wherein when the temperature of the joining layer is within a range from 20° C. to −60° C., the value of the dielectric tangent of the joining layer is lower than 0.0008.

\* \* \* \* \*